(12) United States Patent
Kato

(10) Patent No.: US 7,906,813 B2
(45) Date of Patent: Mar. 15, 2011

(54) SEMICONDUCTOR DEVICE HAVING A FIRST CIRCUIT BLOCK ISOLATING A PLURALITY OF CIRCUIT BLOCKS

(75) Inventor: Juri Kato, Chino (JP)

(73) Assignee: Seiko Epson Corporation, Tokyo (JP)

( * ) Notice: Subject to any disclaimer, the term of this patent is extended or adjusted under 35 U.S.C. 154(b) by 529 days.

(21) Appl. No.: 11/709,179

(22) Filed: Feb. 21, 2007

(65) Prior Publication Data

US 2007/0194383 A1 Aug. 23, 2007

(30) Foreign Application Priority Data

Feb. 23, 2006 (JP) ................................ 2006-046447
Mar. 28, 2006 (JP) ................................ 2006-087643
Oct. 31, 2006 (JP) ................................ 2006-295740

(51) Int. Cl.
*H01L 29/76* (2006.01)
(52) U.S. Cl. ........ 257/365; 257/347; 257/348; 257/349; 257/350; 257/254; 257/E29.287; 257/354
(58) Field of Classification Search .................. 257/365, 257/347, 349, 350, 254, E29.287, 351, 352, 257/353, 348
See application file for complete search history.

(56) References Cited

U.S. PATENT DOCUMENTS

| 4,178,560 | A  | * | 12/1979 | Maury ............................ 331/1 A |
| 6,608,345 | B2 | * | 8/2003  | Kunikiyo et al. ............. 257/314 |
| 7,579,623 | B2 | * | 8/2009  | Atanackovic et al. .......... 257/67 |
| 2004/0155281 | A1 | * | 8/2004 | Osada et al. ................... 257/315 |
| 2005/0121672 | A1 | * | 6/2005 | Yamazaki et al. .............. 257/59 |
| 2005/0156242 | A1 | * | 7/2005 | Yamaguchi et al. .......... 257/347 |
| 2006/0076995 | A1 | * | 4/2006 | Dreps et al. ................... 327/205 |
| 2006/0118873 | A1 | * | 6/2006 | Yamada et al. ............... 257/347 |
| 2006/0214225 | A1 | * | 9/2006 | Holt et al. ..................... 257/347 |
| 2006/0231893 | A1 | * | 10/2006 | Bernstein et al. ............ 257/347 |
| 2007/0018248 | A1 | * | 1/2007 | Chuang et al. ................ 257/351 |
| 2007/0057307 | A1 | * | 3/2007 | Shum et al. .................... 257/314 |
| 2007/0132033 | A1 | * | 6/2007 | Wu et al. ....................... 257/371 |

OTHER PUBLICATIONS

T. Sakai et al., Separation by Bonding Si Islands (SBSI) for LSI Applications, Second International SiGe Technology and Device Meeting, Meeting Abstract, May 2004, pp. 230-231.

* cited by examiner

*Primary Examiner* — Wael M Fahmy
*Assistant Examiner* — Marc Armand
(74) *Attorney, Agent, or Firm* — AdvantEdge Law Group, LLC

(57) ABSTRACT

A semiconductor device, includes: a semiconductor layer, arranged, via an insulation layer, on a region of a part of a semiconductor substrate; a first circuit block formed on the semiconductor layer; and a second and a third circuit blocks formed on the semiconductor substrate, isolated from each other by the first circuit block.

10 Claims, 6 Drawing Sheets

SEMICONDUCTOR DEVICE HAVING A FIRST CIRCUIT BLOCK ISOLATING A PLURALITY OF CIRCUIT BLOCKS

BACKGROUND

1. Technical Field

The present invention relates to a semiconductor device, particularly to the ones in which bulk structures and silicon-on-insulator (hereafter "SOI") structures are combined on the same substrate.

2. Related Art

Field-effect transistors formed on SOI substrates have been attracting attention, due to their high level of usability such as easiness in device isolation, latch-up free characteristics, and a small source/drain junction capacitance. Particularly, researches for achieving the operation of the SOI transistors in a fully depleted mode have been very active, since fully depleted SOI transistors allow rapid operations with low-power consumption, and can be driven with low-voltage. A method of forming the SOI transistors at a low cost, by forming SOI layers on bulk substrates, is disclosed as an example of related art. In the method disclosed in the example of related art, Si/SiGe layer is deposited on an Si substrate, and thereafter, a hollow portion is formed between the Si substrate and the Si layer, by selectively removing only the SiGe layer, using the difference in etching rate between Si and SiGe. Subsequently, by performing thermo oxidation of Si that is exposed inside the hollow portion, $SiO_2$ layer is buried between the Si substrate and the Si layer, thereby forming a BOX layer between the Si substrate and the Si layer.

T. Sakai et al. "Separation by BondingSi Islans (SBSI) for LSI Application", Second International SiGe Technology and Device Meeting, Metting Abstract, pp. 230-231, May 2004, is the above-referenced example of related art.

However, in the case of combining the bulk structure and the SOI structure on the same substrate, an interference caused by the substrate noise may occur between the circuit blocks, depending on the arrangement thereof, resulting in a problem that the reliability declines in the semiconductor device. On the other hand, if the sufficient distance is provided between the adjacent circuit blocks, so as to reduce the interference caused by the noise between the circuit blocks, then the chip size increases, resulting in a problem of causing an increase in packaging area and cost.

SUMMARY

An advantage of the invention is to provide a semiconductor device combining a bulk structure with an SOI structure on the same substrate, while suppressing the interference caused by the noise between circuit blocks.

According to a first aspect of the invention, a semiconductor device includes: a semiconductor layer, arranged, via an insulation layer, on a region of a part of a semiconductor substrate; a first circuit block formed on the semiconductor layer; and a second and a third circuit blocks formed on the semiconductor substrate, isolated from each other by the first circuit block.

Consequently, a plurality of circuit blocks having the bulk structures can be combined on the same semiconductor substrate, isolated from each other by the SOI structure that has a high tolerance against crosstalk noises. This allows a decreasing of the distances between the adjacent circuit blocks, while suppressing the crosstalk noise between the circuit blocks, thereby suppressing the increase in the chip size, allowing to mount various functional components onto a single chip, while improving the characteristics and reliability of semiconductor devices.

It is desirable, in the semiconductor device according to the first aspect of the invention, that the first circuit block be arranged between the second circuit block and the third circuit block.

Consequently, a plurality of circuit blocks having the bulk structures can be combined on the same semiconductor substrate, isolated from each other by the SOI structure, thereby allowing a suppressing of the increase in the chip size, while also suppressing the crosstalk noise between the circuit blocks. Moreover, the periphery of the first circuit block can be surrounded by the semiconductor substrate, improving the heat dissipation from the first circuit block, and thereby improving the temperature characteristic of the first circuit block.

It is desirable, in the semiconductor device according to the first aspect of the invention, that either the second or the third circuit block be arranged to contact at least one side of the first circuit block.

Consequently, a plurality of circuit blocks having the bulk structures can be arranged to be isolated from each other by the SOI structure, even in the case of combining the bulk structure and the SOI structure on the same semiconductor substrate, thereby allowing a suppressing of the increase in the chip size, while also suppressing the crosstalk noise between the circuit blocks.

It is desirable, in the semiconductor device according to the first aspect of the invention, that the semiconductor substrate have a resistivity of more than 500 Ωcm.

It is desirable, in the semiconductor device according to the first aspect of the invention, that the first circuit block be a digital circuit, and the second circuit block and the third circuit block be analog circuits.

Consequently, the digital circuit and the analog circuits can be combined on the same substrate, while forming the digital circuit in the SOI structure, and the analog circuits in the bulk structure. At the same time, noises emitted outward from the digital circuit can be blocked by the SOI structure, while enhancing the latch-up resistance. This suppresses the increase in chip sizes, allowing the digital circuit to operate in high speed, as well as with lower power consumption, while being driven with a low voltage. At the same time, the voltage tolerance and the reliability of the analog circuits can be improved.

It is desirable, in the semiconductor device according to the first aspect of the invention, that the first circuit block be a low-voltage driver circuit, and the second circuit block and the third circuit block be high-voltage driver circuits.

Consequently, the low-voltage driver circuit and the high-voltage driver circuits can be combined on the same semiconductor substrate, while forming the low-voltage driver circuit in the SOI structure, and the high-voltage driver circuits in the bulk structure. At the same time, noises emitted outward from the low-voltage driver circuit can be blocked by the SOI structure, while enhancing the latch-up resistance. This suppresses the increase in chip sizes, allowing the low-voltage driver circuit to operate in high speed as well as with lower power consumption, and at the same time, improving the voltage tolerance and reliability of the high-voltage driver circuit.

According to a second aspect of the invention, a semiconductor device includes: a semiconductor layer, arranged, via an insulation layer, on a region of a part of a semiconductor substrate; a microcontroller (MCU) core formed on the semiconductor layer; and two or more circuit blocks formed on the semiconductor substrate, selected from the group including: a DRAM arranged around the MCU core; a nonvolatile memory; a power circuit; a high-voltage driver; a radio frequency circuit; and an oscillation circuit.

Consequently, a plurality of circuit blocks having the bulk structure can be combined on the same semiconductor substrate, isolated from each other by the SOI structure, in the case of forming the system LSI in a single chip. This allows a decrease of the distances between the circuit blocks, while suppressing the crosstalk noise between the circuit blocks, thereby the system LSI is realized, while suppressing the increase in the chip size, while also improving the characteristics and reliability of the system LSI.

According to a third aspect of the invention, a semiconductor device includes: a semiconductor layer, arranged, via an insulation layer, on a region of a part of a semiconductor substrate; an MCU core formed on the semiconductor layer; and two or more circuit blocks formed on the semiconductor substrate, selected from the group including: a sensor interface circuit arranged around the MCU core; a radio frequency circuit; and an oscillation circuit; wherein the circuit block is provided with an SOI structure arranged on at least one side of the periphery of the circuit block, while contacting another circuit block.

This allows a decreasing of the distances between the adjacent circuit blocks, while suppressing the crosstalk noise between those circuit blocks, in the case of forming a system LSI in a single chip. Thereby, the system LSI is realized while suppressing the increase in the chip size, while also improving the characteristics and reliability of the system LSI.

According to a forth aspect of the invention, a semiconductor device includes: a semiconductor layer, arranged, via an insulation layer, on a region of a part of a semiconductor substrate; an SRAM formed on the semiconductor layer; and two or more circuit blocks formed on the semiconductor substrate, selected from the group including: a power circuit arranged around the SRAM; a driver; and a digital-to-analog converter.

This allows a decreasing of the distances between the circuit blocks, while suppressing the crosstalk noise therebetween, in the case of forming, in a single chip, a driver LSI that has the SRAM. Thereby the driver LSI is realized while suppressing the increase in the chip size, while also improving the characteristics and reliability of the driver LSI.

According to a fifth aspect of the invention, a semiconductor device includes: a semiconductor layer, arranged, via an insulation layer, on a region of a part of a semiconductor substrate; and a real-time clock circuit and a circuit operative on stand-by, both of which being formed on the semiconductor layer.

According to a sixth aspect of the invention, a semiconductor device includes: an SOI region in which a semiconductor layer is deposited on an insulation layer; a bulk region having only a substrate as an underlying layer; and a first dopant diffusion layer for potential fixing, deposited on the semiconductor substrate, between a circuit element formed in the silicon-on-insulator region and a circuit element formed in the bulk region; wherein the silicon-on-insulator region and the bulk region are on the same semiconductor substrate.

This allows the first dopant diffusion layer to block the electric flux line generated between the circuit element formed in the SOI region and the circuit element formed in the bulk region, thereby suppressing the crosstalk noise therebetween. Consequently, it is possible to prevent the improper operation of the semiconductor device.

It is desirable that the semiconductor device according to the sixth aspect of the invention further include: the silicon-on-insulator region including a first silicon-on-insulator region and a second silicon-on-insulator region which is thicker than the first silicon-on-insulator region; and a second dopant diffusion layer for potential fixing, formed on the semiconductor layer, between a circuit element formed in the first silicon-on-insulator region and a circuit element formed in the second silicon-on-insulator region. Here, in the first SOI region, a transistor that is, for instance, a partially depleted one is formed, and in the second SOI region, a transistor that is, for instance, a fully depleted one is formed.

This allows the second dopant diffusion layer to block the electric flux line generated between the circuit element formed in the first SOI region and the circuit element formed in the second SOI region, thereby suppressing the crosstalk noise within those SOI regions.

It is desirable that the semiconductor device according to the sixth aspect of the invention further include a third dopant diffusion layer for potential fixing, on the semiconductor substrate under the insulation layer in the SOI region.

In this case, the first dopant diffusion layer and the third dopant diffusion layer may both have a first conductivity type; and the first dopant diffusion layer may have a higher dopant concentration of the first conductivity type than the third dopant diffusion layer.

In this case, the second dopant diffusion layer and the third dopant diffusion layer may both be of a first conductivity type; and the second dopant diffusion layer may have a higher dopant concentration of the first conductivity type than the third dopant diffusion layer.

In the semiconductor device according to the sixth aspect of the invention, it is easy to block the electric flux line curling in from the bulk region to underneath the insulation layer in the SOI region, as well as to prevent the transmission of noise generated in the SOI region toward the semiconductor substrate.

It is desirable that, in the semiconductor device according to the sixth aspect of the invention, the semiconductor substrate have a resistivity of more than 500 Ωcm. This allows the further improvement of the crosstalk-noise resistance of the semiconductor substrate, since the substrate resistance under the insulation layer inside the SOI region can be increased in this structure.

According to a seventh aspect of the invention, a semiconductor device includes: a first silicon-on-insulator region in which a first semiconductor layer is deposited on an insulation layer; a second silicon-on-insulator region in which a second insulation layer and a second semiconductor layer are deposited on the first semiconductor layer; and a dopant diffusion layer for potential fixing, deposited on the first semiconductor substrate, between a circuit element formed in the first silicon-on-insulator region and a circuit element formed in the second silicon-on-insulator region; wherein the first silicon-on-insulator region and the second silicon-on-insulator region are on the same supporting substrate.

This allows the dopant diffusion layer to block the electric flux line generated between the circuit element formed in the first SOI region and the circuit element formed in the second SOI region, thereby suppressing the crosstalk noise between those regions. Consequently, it is possible to prevent the improper operation of the semiconductor device.

According to an eighth aspect of the invention, a semiconductor device includes: a semiconductor layer, arranged, via an insulation layer, on a region of a part of a semiconductor substrate; a first circuit block formed on the semiconductor layer; a second circuit block formed on the semiconductor substrate in the perimeter of the prescribed regions; and a dopant diffusion layer for potential fixing, formed on the semiconductor substrate, between the first circuit block and the second circuit block.

This allows the dopant diffusion layer to block the electric flux line generated between the first circuit block that has the SOI structure and the second circuit block that has the bulk structure, suppressing the crosstalk noise between the first and the second circuit blocks, thereby preventing an improper operation of the semiconductor device.

According to a ninth aspect of the invention, a semiconductor device includes: a semiconductor layer, arranged, via an insulation layer, on a region of a part of a semiconductor substrate; an MCU core formed on the semiconductor layer; a peripheral circuit block which is formed on the semiconductor substrate and arranged in the perimeter of the MCU core, while having at least one of a member of the group including: a memory circuit; a power circuit; an oscillation circuit; and an analog-to-digital converter; and a dopant diffusion layer for potential fixing, formed on the semiconductor substrate, between the MCU core and the peripheral circuit block.

This allows the dopant diffusion layer to block the electric flux line generated between the MCU core that has the SOI structure and the peripheral circuit block that has the bulk structure, suppressing the crosstalk noise therebetween, in the case of forming the system LSI in a single chip. This allows a prevention of the improper operation of the system LSI, thereby improving the operational reliability.

According to a tenth aspect of the invention, a semiconductor device includes: a semiconductor layer, arranged, via an insulation layer, on a region of a part of a semiconductor substrate; an MCU core formed on the semiconductor layer; a first peripheral circuit block which is formed on the semiconductor substrate and arranged in the perimeter of the MCU core, while having at least one of a member of the group including: a sensor interface circuit; a radio frequency circuit; a liquid crystal controller; and a power circuit; and a second peripheral circuit block formed on the semiconductor substrate; an SOI structure arranged on at least one side of the periphery of the first peripheral circuit block, while being adjacent to the second peripheral circuit block; and a dopant diffusion layer for potential fixing, formed on the semiconductor substrate, between the microcontroller core and the first peripheral circuit block.

This allows the dopant diffusion layer to block the electric flux line generated between the MCU core that has the SOI structure and the first peripheral circuit block that has the bulk structure, suppressing the crosstalk noise therebetween, in the case of forming the system LSI in a single chip. Moreover, the crosstalk noise between the first peripheral circuit block and the second peripheral circuit block can also be suppressed by the SOI structure. This allows a prevention of the improper operation of the system LSI, thereby improving the operational reliability.

Here, if the RTC circuit and the circuits to which the voltage is impressed during the stand-by are formed in fully depleted SOI structure, then the power consumption during stand-by can be significantly reduced. Moreover, due to the high crosstalk noise tolerance, the circuits having the bulk structure can be driven in a high voltage during the operation, while the RTC circuit and the stand-by operational circuit being driven in a low voltage.

According to an eleventh aspect of the invention, a semiconductor device includes: a semiconductor layer, arranged, via an insulation layer, on a region of a part of a semiconductor substrate; an SRAM formed on the semiconductor layer; a peripheral circuit block which is formed on the semiconductor substrate and arranged in the perimeter of the SRAM, while having at least one of a member of the group including: a power circuit; a driver; an input-output circuit; and a digital-to-analog converter; and a dopant diffusion layer for potential fixing, formed on the semiconductor substrate, between the SRAM and the peripheral circuit block.

This allows the dopant diffusion layer to block the electric flux line generated between the SRAM that has the SOI structure and the peripheral circuit block that has the bulk structure, suppressing the crosstalk noise therebetween, in the case of forming, in a single chip, a driver LSI that has the SRAM. This enables to prevent the improper operation of the driver LSI, thereby improving the operational reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

A method for manufacturing a semiconductor device in accordance with embodiments of the invention will now be described with references to the accompanying drawings.

First Embodiment

Figure 1:
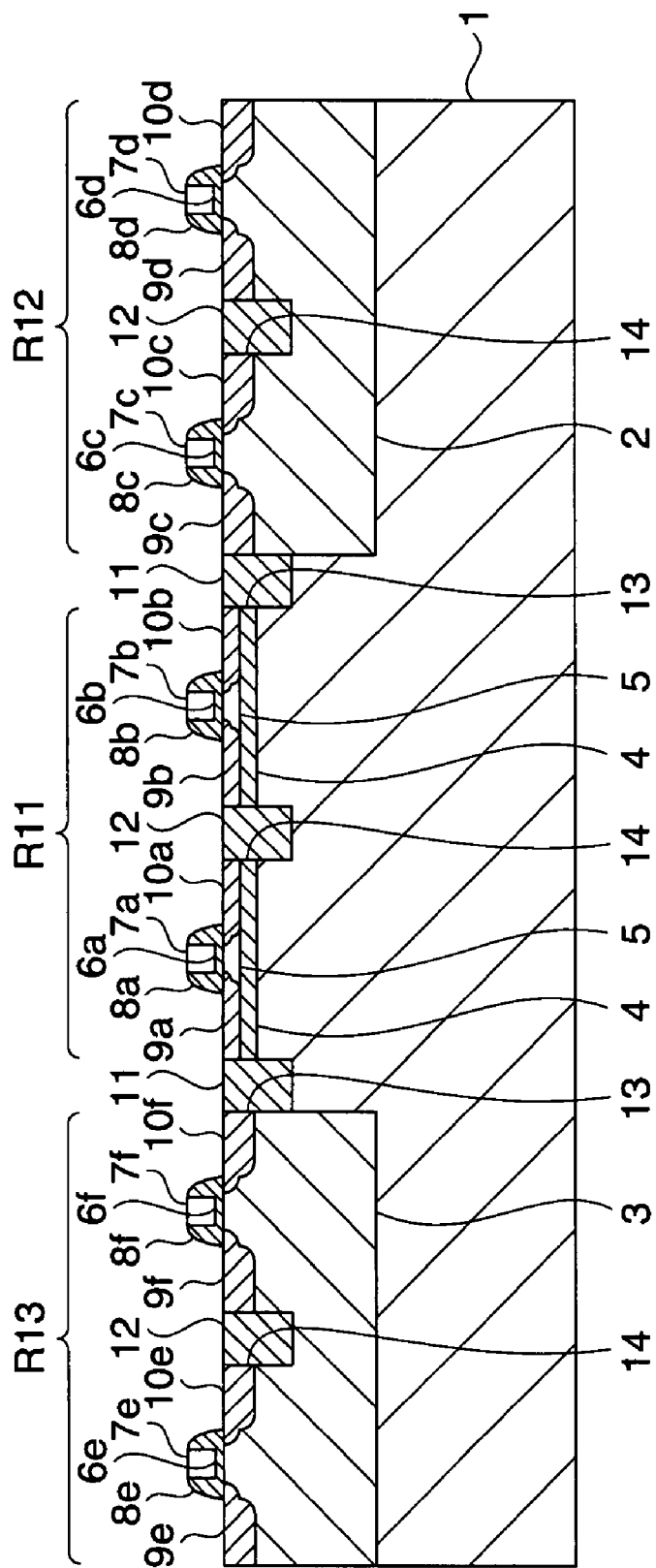
FIG. 1 is a sectional drawing illustrating a configuration example of a semiconductor device according to a first embodiment.

FIG. 1 is a sectional drawing illustrating a configuration example of a semiconductor device according to the first embodiment.

In FIG. 1, an SOI forming region R11 and a bulk regions R12 and R13 are provided on a semiconductor substrate 1, and wells 2 and 3 are formed in the bulk regions R12 and R13. Here, the bulk regions R12 and R13 can be arranged on the semiconductor substrate 1 so as to be isolated from each other by the SOI forming region R11. For instance, the SOI forming region R11 can be formed between the bulk region R12 and the bulk region R13. In the case of using a high-resistant substrate with resistivity of more than 500 Ωcm for the semiconductor substrate 1, the substrate resistance under an insulation film 4 in the silicon-on-insulator forming region can be increased.

In the SOI forming region R11 and the bulk regions R12 and R13, grooves 14 are formed, isolating devices in the SOI forming region R11 as well as in the bulk regions R12 and R13. Moreover, at the border between the SOI forming region R11 and the bulk region R12, as well as at the border between the SOI forming region R11 and the bulk region R13, grooves 13 are formed, isolating devices in the SOI forming region R11 from the bulk regions R12 and R13. Buried insulators 11 and 12 are buried in the grooves 13 and 14. Examples for buried insulators 11 and 12 buried in the grooves 13 and 14 include films such as silicon oxide film and silicon nitride film.

In the SOI forming region R11, a buried insulation layer 4 is formed on the semiconductor substrate 1, and on the buried insulation layer 4, a semiconductor layer 5 is deposited, isolated by the groove 13 and the groove 14. Further, gate electrodes 7a and 7b are formed on the semiconductor layer 5 via gate insulation films 6a and 6b, and sidewalls 8a and 8b are formed on the sides of the gate electrodes 7a and 7b. Still further, on the semiconductor layer 5, a source layer 9a and a drain layer 10a are formed, arranged so as to sandwich the gate electrode 7a, and, a source layer 9b and a drain layer 10b are formed, arranged so as to sandwich the gate electrode 7b.

In the bulk region R12, gate electrodes 7c and 7d are formed on a well 2 via gate insulation films 6c and 6d, and sidewalls 8c and 8d are formed on the sides of the gate electrodes 7c and 7d. Further, on the well 2, a source layer 9c and a drain layer 10c are formed, arranged so as to sandwich the gate electrode 7c, and, a source layer 9d and a drain layer 10d are formed, arranged so as to sandwich the gate electrode 7d.

In the bulk region R13, gate electrodes 7e and 7f are formed on a well 3 via gate insulation films 6e and 6f, and sidewalls 8e and 8f are formed on the sides of the gate electrodes 7e and 7f. Moreover, on the well 3, a source layer 9e and a drain layer 10e are formed, arranged so as to sandwich the gate electrode 7e, and, a source layer 9f and a drain layer 10f are formed, arranged so as to sandwich the gate electrode 7f.

Examples of materials for the semiconductor substrate 1 and the semiconductor layer 5 include Si, Ge, SiGe, SiC, SiSn, PbS, GaAs, InP, GaP, GaN, and ZnSe. The semiconductor substrate 1 on which the SOI forming region R11 and the bulk regions R12 and R13 are provided can be formed, using the SOI substrate, or with separation-by-bonding-Si-islands (SBSI) method. Examples of the SOI substrate include a separation by implanted oxygen (SIMOX) substrate, a bonded substrate, and a laser-annealed substrate. Substrates such as the ones formed with sapphire or glass may also be used, alternatively to the semiconductor substrate 1.

Consequently, a plurality of circuit blocks formed on the bulk regions R12 and R13 can be installed on the same semiconductor substrate 1, isolated from each other by the SOI forming region R11 that has a tolerance against crosstalk noises. This allows a decreasing of the distances between the adjacent circuit blocks, while suppressing the crosstalk noise between the circuit blocks formed on the semiconductor substrate 1, thereby suppressing the increase in a chip size, allowing to mount various functional components onto a single chip, while improving the characteristics and reliability of semiconductor devices. The crosstalk noise tolerance of the substrate further increases, if a high-resistance substrate is used as the semiconductor substrate 1. Moreover, the bulk regions R12 and R13 can surround the perimeter of the SOI forming region R11, improving the heat dissipation from the SOI forming region R11, and thereby improving the temperature characteristic of the circuit blocks formed on the SOI forming region R11.

In the above-referenced embodiment, a method for device isolation of the SOI forming region R11 and the bulk regions R12 and R13 in a shallow trench isolation (STI) structure is described, while device isolation with local oxidation of silicon (LOCOS) structure may also be employed.

Low-voltage, low-current driver devices can be formed on the SOI forming region R11, and high-voltage tolerant, high-voltage driver devices can be formed on the bulk regions R12 and R13. Consequently, low-voltage driver circuits and high-voltage driver circuits can be combined on the same semiconductor substrate 1, forming the low-voltage driver circuits in the SOI structure, and high-voltage driver circuits in the bulk structure. At the same time, noises emitted outward from the low-voltage driver circuit can be blocked by the SOI structure, while enhancing the latch-up resistance. This suppresses the increase in chip sizes, allowing the low-voltage driver circuit to operate in high speed as well as with lower power consumption, and at the same time, improving the voltage tolerance and reliability of the high-voltage driver circuit. Alternatively, logic circuits or SRAM can be formed on the SOI forming region R11, and electrostatic protection circuits, analog circuits, or bipolar transistors can be formed on the bulk regions R12 and R13.

Second Embodiment

FIGS. 2A to 2E are top view drawings illustrating configuration examples of a semiconductor device according to a second embodiment.

Figure 2A:
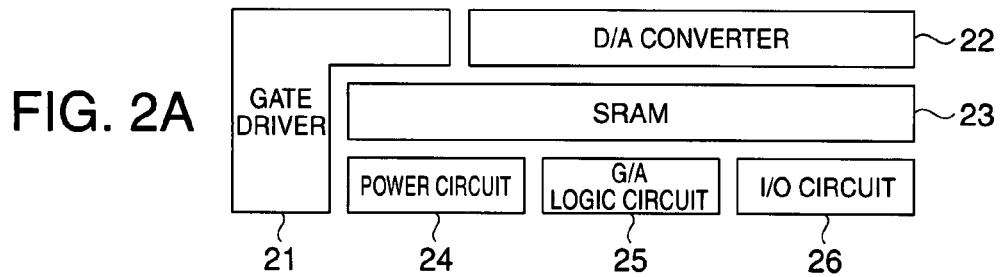
FIGS. 2A to 2E are top view drawings illustrating configuration examples of a semiconductor device according to a second embodiment.

As shown in FIG. 2A, a plurality of circuit blocks is mounted on a semiconductor chip, and a gate driver 21, digital-to-analog (hereinafter "D/A") converter 22, an SRAM 23, a power circuit 24, a gate array logic circuit 25, and an input-output (hereinafter "I/O") circuit 26 are formed as the circuit blocks. Here, the gate driver 21, the D/A converter 22, the power circuit 24, and the I/O circuit 26 are arranged in the bulk regions, and the SRAM 23 and the gate array logic circuit 25 are arranged in the SOI forming regions. Moreover, the circuit blocks formed in the bulk regions can be arranged to contact at least one side of the circuit blocks formed in the SOI forming regions. Further, the circuit blocks formed in the SOI regions can be arranged between the circuit blocks formed in the bulk forming regions.

This allows a decreasing of the distances between the adjacent circuit blocks, while suppressing the crosstalk noise between the circuit blocks, in the case of forming, in a single chip, a driver LSI that has the SRAM 23. Thereby the driver LSI is realized while suppressing the increase in the chip size, while also improving the characteristics and reliability of the driver LSI.

Figure 2B:
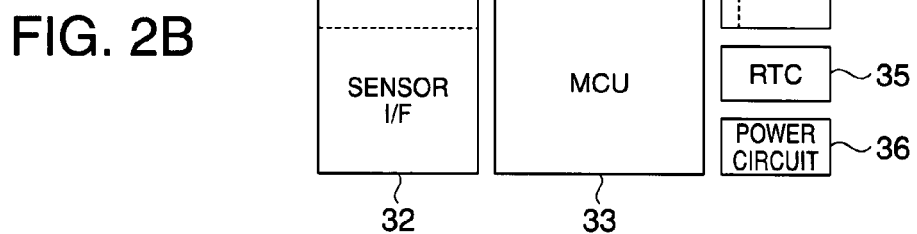

As shown in FIG. 2B, a plurality of circuit blocks is mounted on the semiconductor chip, and a liquid crystal controller 31, a sensor interface circuit 32, a microcontroller unit (MCU) 33, a radio frequency (RF) circuit 34, a real time clock circuit 35, and a power circuit 36 are formed as the circuit blocks. Here, the liquid crystal controller 31 and the power circuit 36 are arranged in the bulk regions, and the MCU 33 and the RTC circuit 35 are arranged in the SOI forming regions. Moreover, the sensor interface circuit 32 and the RF circuit 34 are arranged in the bulk region, and at the same time, the SOI structures are installed, arranged to contact other circuit blocks, while arranged on at least one side of the periphery of the sensor interface circuit 32 and the RF circuit 34.

This allows a decreasing of the distances between the adjacent circuit blocks, while suppressing the crosstalk noise between the circuit blocks, in the case of forming a system LSI in a single chip. Thereby, the system LSI is realized while suppressing the increase in the chip size, while also improving the characteristics and reliability of the system LSI. Here, if the RTC circuit and the circuits to which the voltage is impressed during the stand-by are formed in fully depleted SOI structure, the power consumption during stand-by can be significantly reduced. There is no increase in power consumption, if the circuit regions in which the voltage is not impressed during the stand-by are formed in the bulk regions.

Figure 2C:
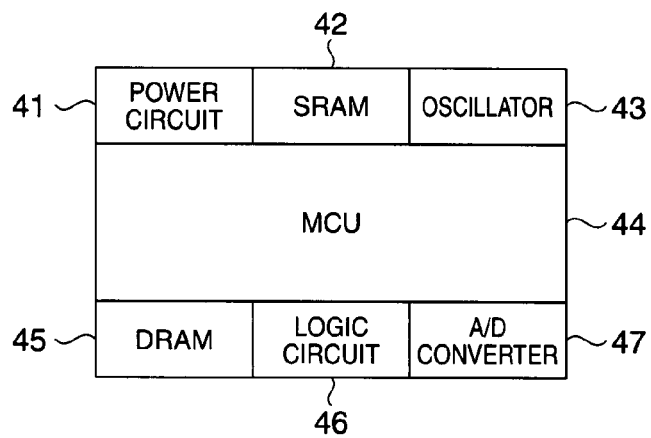

As shown in FIG. 2C, a plurality of circuit blocks is mounted on the semiconductor chip, and a power circuit 41, an SRAM 42, an oscillator 43, an MCU 44, a DRAM 45, a logic circuit 46, and an analog-to-digital (hereinafter "A/D") converter 47 are formed as the circuit blocks. Here, the power circuit 41, the oscillator 43, the DRAM 45, and the A/D converter 47 are arranged in the bulk regions, and the SRAM 42, the MCU 44, and the logic circuit 46 are arranged in the SOI forming regions. Moreover, the circuit blocks formed in the bulk regions can be arranged to contact at least one side of the circuit blocks formed in the SOI forming regions. Further, the circuit blocks formed in the SOI regions can be arranged between the circuit blocks formed in the bulk forming regions.

Consequently, a plurality of circuit blocks having the bulk structure can be combined on the same semiconductor substrate, isolated from each other by the SOI structure, in the case of forming the system LSI in a single chip. This allows a decrease of the distances between the circuit blocks, while suppressing the crosstalk noise between the circuit blocks, thereby the system LSI is realized while suppressing the increase in the chip size, while also improving the characteristics and reliability of the system LSI.

Figure 2D:
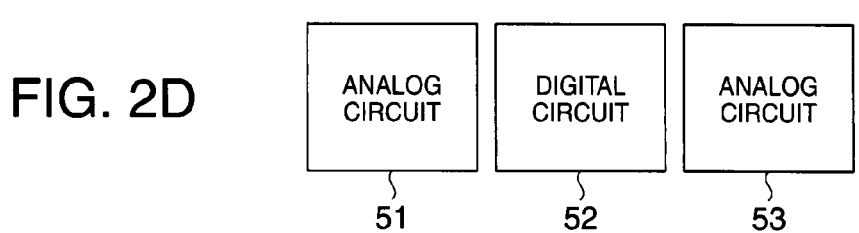

As shown in FIG. 2D, a plurality of circuit blocks is mounted on the semiconductor chip, and analog circuits 51 and 53, as well as digital circuit 52 are formed as the circuit blocks. Here, the analog circuits 51 and 53 are arranged in the bulk regions, and the digital circuit 52 is arranged in the SOI forming region. Moreover, the circuit blocks formed in the bulk regions can be arranged to contact at least one side of the circuit blocks formed in the SOI forming regions. Further, the circuit blocks formed in the SOI regions can be arranged between the circuit blocks formed in the bulk forming regions.

Consequently, the digital circuit 52 and the analog circuits 51 and 53 can be combined on the same substrate, while forming the digital circuit 52 in the SOI structure, and the analog circuits 51 and 53 in the bulk structure. At the same time, noises emitted outward from the digital circuit 62 can be blocked by the SOI structure, while enhancing the latch-up resistance. Moreover, the analog circuits 51 and 53 are distant from one another, having the SOI structure in between, resulting in the improvement of the crosstalk tolerance between the analog circuit blocks (i.e., between the analog circuit 51 and 53). This suppresses the increase in chip sizes, allowing the digital circuit 52 to operate in high speed, as well as with lower power consumption, while being driven in a lower voltage. At the same time, the voltage tolerance and the reliability of the analog circuits 51 and 53 can be improved.

Figure 2E:
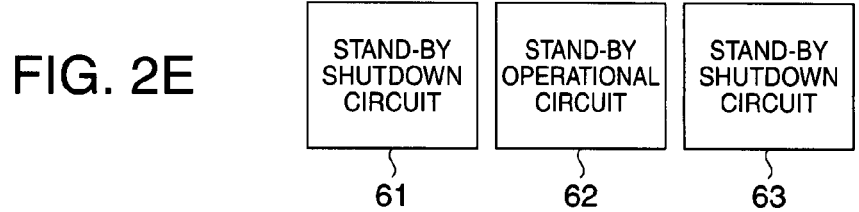

As shown in FIG. 2E, a plurality of circuit blocks is mounted on the semiconductor chip. A circuit 62 that needs to operate during the stand-by, as well as shutdown circuits 61 and 63 to which no voltage is impressed during the stand-by, are formed as the circuit blocks. Here, the stand-by operational circuit 62 can be arranged in the SOI forming region, utilizing a fully depleted SOI device. Consequently, the voltage for the stand-by operational circuit 62 can be set low, and the current leak during the stand-by can be suppressed. As a result, power consumption of the entire LSI during the stand-by can be significantly reduced. Moreover, the stand-by shutdown circuits 61 and 63 may be formed in either of the bulk regions or the SOI region. At this time, the circuit blocks formed in the bulk regions can be arranged to contact at least one side of the circuit blocks formed in the SOI forming region. Consequently, a semiconductor device having an excellent tolerance in substrate crosstalk noise can be provided, while significantly reducing the power consumption during the stand-by.

Third Embodiment

Figure 3:
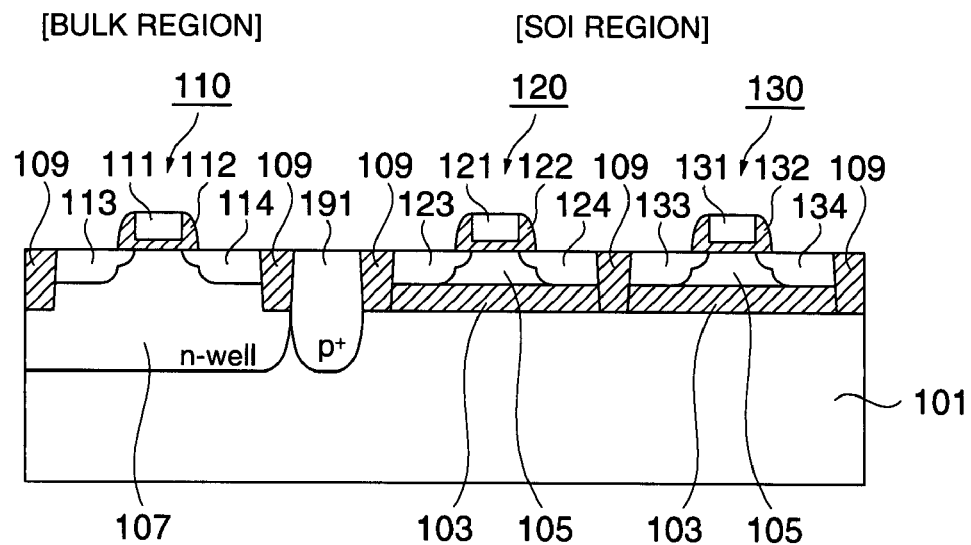
FIG. 3 is a sectional drawing illustrating a configuration example of a semiconductor device according to a third embodiment.

FIG. 3 is a sectional drawing illustrating a configuration example of a semiconductor device according to a third embodiment.

As shown in FIG. 3, this semiconductor device has the bulk region and the SOI region formed in a semiconductor substrate 101. Here, the bulk region means that the region has only the semiconductor substrate 101 as an underlying layer. Moreover, the SOI region means that semiconductor layers 105 are formed on the semiconductor substrate 101 via insulation layers 103. Examples of the semiconductor substrate 101 include a p-type silicon (Si) substrate, and examples of the insulation layers 103 include silicon oxide film ($SiO_2$). The semiconductor layers 105 are formed with, for instance, Si. Such semiconductor substrate (device) having the bulk region and the SOI region in the same substrate is formed, for instance, with the SBSI method.

As shown in FIG. 3, a well 107 of, for instance, an n-type, is formed in the semiconductor substrate 101 within the bulk region. Device isolation films 109 are formed in the perimeter of the well 107, and a metal-insulator-semiconductor (MIS) transistor 110 is formed in the region surrounded by the device isolation films 109. That is to say, a gate electrode 111 is formed on the well 107 via a gate insulation film, and sidewalls 112 are formed on both sides of the gate electrode 111. A source 113 and a drain 114 are formed in the well 107 at the sides of the gate electrode 111.

At the same time, an insulation layers 103 are formed in the semiconductor substrate 101 within the SOI regions, and a semiconductor layers 105 are formed on the insulation layers 103. The device isolation films 109 are formed in the SOI regions, and MIS transistors 120 and 130 are formed in the region surrounded by the device isolation films 109. That is to say, in one of the SOI regions, a gate electrode 121 is formed via the gate insulation film, and sidewalls 22 are formed on both sides of the gate electrode 121. A source 123 and a drain 124 are formed in the semiconductor layer 105 at the sides of the gate electrode 121. Similarly, in the other SOI region, a gate electrode 131 is formed via the gate insulation film, and sidewalls 32 are formed on both sides of the gate electrode 131. A source 133 and a drain 134 are formed in the semiconductor layer 105 at the sides of the gate electrode 131.

The device isolation film 109 is formed with, for instance, $SiO_2$, with methods such as STI or LOCOS. The un-illustrated gate insulation film is formed with materials such as $SiO_2$, silicon oxide nitride (SiON) film, silicon nitride (SiN) film, or the combinations thereof. The gate electrodes 111, 121, and 131 are composed of materials such as polycrystalline silicon that includes conductive dopants such as phosphorus and boron. The sidewalls 112, 122, and 132 are formed with, for instance, $SiO_2$.

Hereafter, for the convenience of description, the MIS transistors formed in the bulk regions are referred to as "bulk transistors". Moreover, the MIS transistors formed in the SOI regions are referred to as "SOI transistors".

In this semiconductor device, a dopant diffusion layer 191 for potential fixing is formed on the semiconductor substrate 101, between the bulk transistor 110 and the SOI transistor 120. The conductivity type of this dopant diffusion layer 191 is, for instance, p-type, and in order to fix the potential in this semiconductor device, a reverse bias (in other words, a negative potential) is impressed to the dopant diffusion layer 191 during the operation of the semiconductor device. This allows the dopant diffusion layer 191 to block the electric flux line generated between the bulk transistor 110 and the SOI transistor 120, suppressing the crosstalk noise between those transistors 110 and 120.

In the case where, for instance, the SOI transistor 120 functions as a circuit element constituting the low-voltage driver digital circuit, and the bulk transistor 110 functions as a circuit element constituting the high-voltage driver circuit (or an analog circuit), the high-voltage noise of electric flux line (in other words, noise generated by impressing a high voltage to the source or the drain) emitted from the bulk transistor 110 is terminated at the dopant diffusion layer 191, by impressing the reverse bias to the dopant diffusion layer 191 so as to fix the potential thereof. Moreover, since the depletion layer extends from the dopant diffusion layer 191 toward the semiconductor substrate 101 by impressing the reverse bias, the depletion layer blocks the high field from the bulk transistor 110. As a result, the inversion is prevented in the vicinity of the insulation layers 103 that are under the semiconductor layers 105 directly under the gate electrode 121.

A rapid signal switching in the digital circuit generates large amount of noise. However, since the SOI transistors 120 and 130 are separated from the semiconductor substrate 101 by the insulation layers 103, the noise transmission to the semiconductor substrate 101 can be suppressed. Further, there is no DC current path due to the device isolation films 109 formed between the bulk transistor 110 and the SOI transistors.

Hence, the crosstalk noise between the bulk transistor 110 and the SOI transistor 120, as well as the SOI transistor 130, can be suppressed, preventing an improper operation of the low-voltage driver digital circuit and of the high-voltage driver circuit (or analog circuit). Consequently, it is possible to improve the operation reliability of the semiconductor device.

Here, it is desirable to use a high-resistance substrate with resistivity of more than 500 Ωcm for the semiconductor substrate 101. This allows the further improvement of the crosstalk-noise tolerance of the semiconductor substrate, since the substrate tolerance under the insulation layers 103 inside the SOI region can be increased in this structure.

In this third embodiment, the dopant diffusion layer 191 corresponds to the "first dopant diffusion layer" referred in claim 11 through claim 16; the bulk transistor 110 corresponds to the "circuit element formed in the bulk region" referred in claim 11 through claim 16; and the SOI transistors 120 and 130 correspond to the "circuit elements formed in the silicon-on-insulator regions" referred in claim 11, and claim 13 through claim 16.

Forth Embodiment

Figure 4:
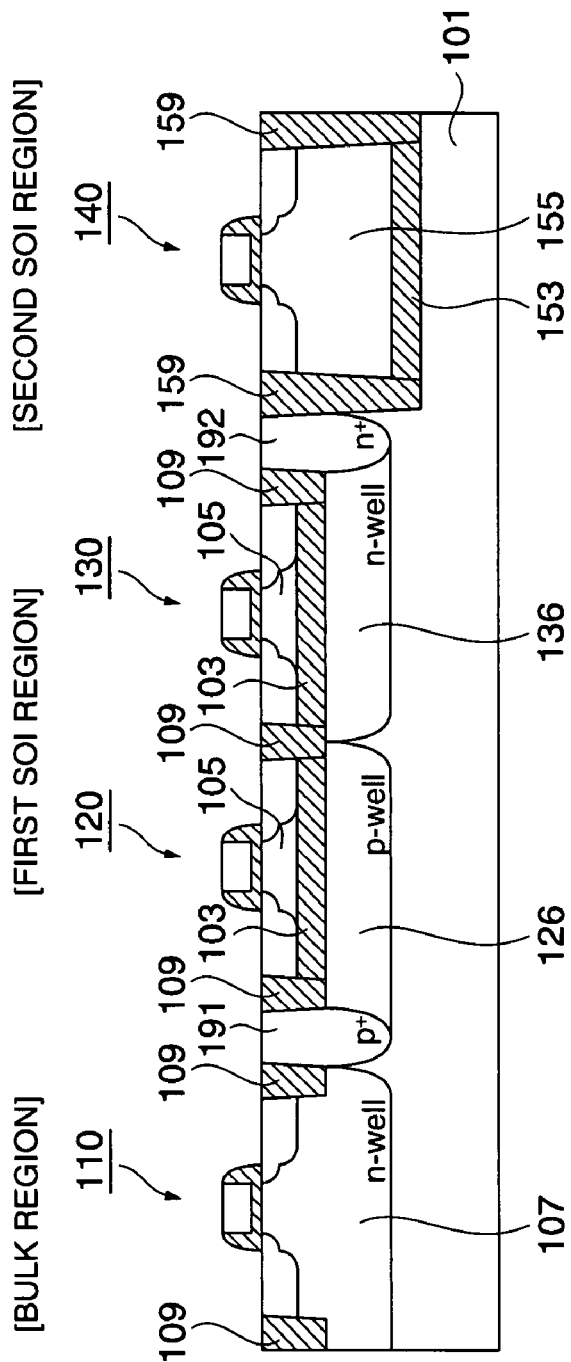
FIG. 4 is a sectional drawing illustrating a configuration example of a semiconductor device according to a forth embodiment.

FIG. 4 is a sectional drawing illustrating a configuration example of a semiconductor device according to the forth embodiment. The same signs and numerals as that of FIG. 3 are used in FIG. 4 for the parts having the same structure as indicated in FIG. 3, and the overlapping description thereof is omitted.

As shown in FIG. 4, this semiconductor device has the bulk region, as well as the first and the second SOI regions formed in a semiconductor substrate 101. The n-type well 107 is formed in the semiconductor substrate 101 within the bulk region. The device isolation films 109 are formed in the perimeter of the well 107, and the bulk transistor 110 is formed in the region surrounded by the device isolation films 109.

Moreover, the insulation layers 103 are formed in the semiconductor substrate 101 within the first SOI regions, and the semiconductor layers 105 are formed on the insulation layers 103. The device isolation films 109 are formed in the first SOI regions, and the SOI transistors 120 and 130 that are, for instance, fully depleted, are formed in the region surrounded by the device isolation films 109.

Here, in the fully depleted SOI transistors, the semiconductor layer has a thickness of, for instance, 50 nm or less, and the entire body sandwiched by the source/drain is fully depleted. A precipitous sub threshold characteristics is obtained in the fully depleted transistors, allowing to keep the threshold voltage low, while suppressing the off-leak current, thereby enabling rapid operation in a low-voltage. Due to the above characteristics, the fully depleted transistors are often used as a circuit element of the low-voltage driver logic circuit.

Particularly, the power consumption during the stand-by can be significantly reduced, by forming the RTC circuit that operates during the stand-by and the circuit to which the voltage is impressed during the stand-by in the first SOI region.

Moreover, the insulation layer 153 is formed in the second SOI regions, and the semiconductor layer 155 is formed thereon. The device isolation films 159 are formed in the second SOI regions, extending deeper than the device isolation films 109 in the direction of substrate, and the SOI transistor 140 that is, for instance, partially depleted, is formed in the region surrounded by the device isolation films 159.

Here, in the partially depleted SOI transistor, the semiconductor layer has a thickness of, for instance, 100 nm or more, and the bottom of the body is fully not depleted. The partially depleted SOI transistors have approximately the same level of sub-threshold characteristics as that of the bulk transistors, which means that from the viewpoint of low-power consumption, the effect is not as much as that of the fully depleted ones. On the other hand, the partially depleted ones excel in voltage tolerance, compared to the fully depleted ones. Due to the above characteristics, the partially depleted transistors are often used as a circuit element of the high-voltage driver circuit.

The insulation layer 153 in the second SOI region is formed with, for instance, $SiO_2$, and the semiconductor layer 155 is formed with, for instance, Si. The device isolation films 159 surrounding the second SOI region are formed with, for instance, $SiO_2$, using STI or LOCOS method.

In this semiconductor device, the dopant diffusion layer 191 of, for instance, p-type, is formed on the semiconductor substrate 101, between the bulk transistor 110 and the SOI transistor 120. Moreover, a dopant diffusion layer 192 of, for instance, n-type, is formed between the fully depleted SOI transistor 130 and the partially depleted SOI transistor 140. Further, in the semiconductor substrate 101 under the insulation layer 103 directly under the SOI transistor 120, a p-type well 126 is formed, and in the semiconductor substrate 101 under the insulation layer directly under the SOI transistor 130.

As shown in FIG. 4, the dopant diffusion layer 191 is in junction with the well 126 inside the semiconductor substrate 101, and the p-type dopant concentration is higher in the dopant diffusion layer 191 than in the well 126. Moreover, the dopant diffusion layer 192 is in junction with the well 136 inside the semiconductor substrate 101, and the n-type dopant concentration is higher in the dopant diffusion layer 192 than in the well 136. When operating this semiconductor device, a bias (for example, a negative potential) is impressed on the dopant diffusion layer 191, in order to fix the potentials of the dopant diffusion layer 191 and of the well 126. At the same time, the same bias or a reverse bias (in other words, a positive potential) is impressed on the dopant diffusion layer 192, in order to fix the potentials of the dopant diffusion layer 192 and the well 136.

This allows the dopant diffusion layer 191 to block the electric flux line generated between the bulk transistor 110 and the SOI transistor 120. This also allows the dopant diffusion layer 192 to block the electric flux line generated between the SOI transistor 130 and the SOI transistor 140.

Moreover, in this semiconductor device, the well 126 is formed in the semiconductor substrate 101, under the insulation layer 103 directly under the SOI transistor 120. Therefore, it is easy to block the electric flux line curling in from the bulk region to underneath the SOI transistor 120, as well as to prevent the transmission of noise generated in the SOI transistor 120 toward the semiconductor substrate 101. Similarly, in this semiconductor device, the well 136 is formed in the semiconductor substrate 101, under the insulation layer 103 directly under the SOI transistor 130. Therefore, it is easy to block the electric flux line curling in from the second SOI region to underneath the SOI transistor 130, as well as to prevent the transmission of noise generated in the SOI transistor 130, toward the semiconductor substrate 101.

In this forth embodiment, the dopant diffusion layer 191 corresponds to the "first dopant diffusion layer" referred in claim 11 through claim 15; the bulk transistor 110 corresponds to the "circuit element formed in the bulk region" referred in claim 11 through claim 15; the SOI transistors 120 and 130 correspond to the "circuit elements formed in the (first) silicon-on-insulator region" referred in claim 11 through claim 15; and the SOI transistor 140 corresponds to the "circuit element formed in the second silicon-on-insulator region" referred in claim 12 through claim 15. Further, the dopant diffusion layer 192 corresponds to the "second dopant diffusion layer" referred in claim 12 through claim 15.

Fifth Embodiment

Figure 5:
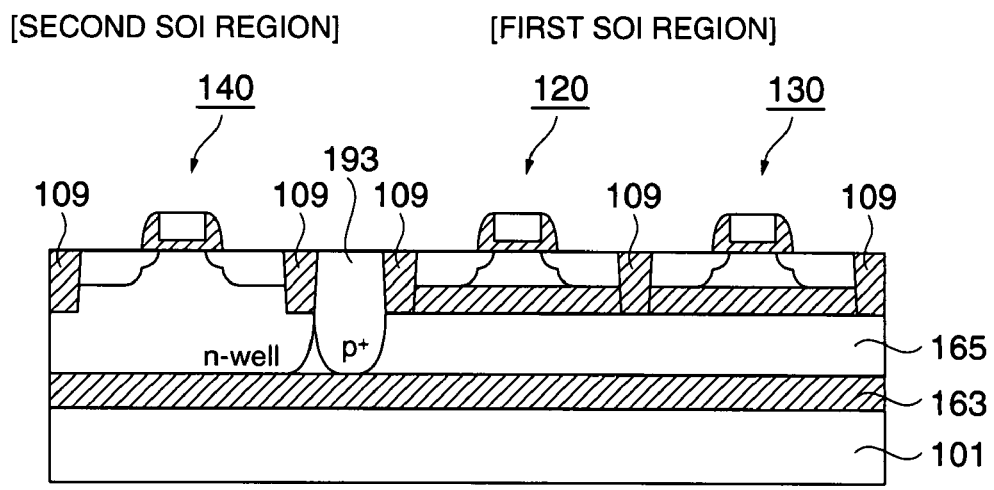
FIG. 5 is a sectional drawing illustrating a configuration example of a semiconductor device according to a fifth embodiment.

FIG. 5 is a sectional drawing illustrating a configuration example of a semiconductor device according to the fifth embodiment. The same signs and numerals as that of FIGS. 3 and 4 are used in FIG. 5 for the parts having the same structure as indicated in FIGS. 3 and 4, and the overlapping description thereof is omitted.

As shown in FIG. 5, this semiconductor device has the first and the second SOI regions in a semiconductor substrate 101, and a first insulation layer 163 and a first semiconductor layer 165 are deposited on the part of the semiconductor substrate 101. In the second SOI region, the partially depleted SOI transistor 140 is formed on the first semiconductor layer 165. Moreover, in the first SOI region, the second insulation layers 103 and the second semiconductor layers 105 are deposited on the first semiconductor layer 165, and the fully depleted SOI transistors 120 and 130 are formed on the second insulation layers 105.

In this semiconductor device, a dopant diffusion layer 193 for potential fixing is formed between SOI transistor 120 in the first SOI region and the SOI transistor 140 in the second SOI region. The conductivity type of the semiconductor layer 193 is, for instance, a p-type. When operating this semiconductor device, a reverse bias (in other words, a negative potential) is impressed on the dopant diffusion layer 193, in order to fix the potential thereof. This allows the dopant diffusion layer 193 to block the electric flux line generated between the fully depleted SOI transistor 120 and the partially depleted SOI transistor 140, suppressing the crosstalk noise between those transistors 120 and 140.

In this fifth embodiment, the semiconductor substrate 101 corresponds to the "supporting substrate" referred in claim 17; the SOI transistors 120 and 130 correspond to the "circuit element formed in the first silicon-on-insulator region" referred in claim 17; and the SOI transistor 140 corresponds to the "circuit element formed in the second silicon-on-insulator region" referred in claim 17.

As described, in the third to fifth embodiments, the dopant diffusion layers 191, 192, and 193, as well as the wells 126 and 136 are formed in the periphery of the SOI structure within the circuit blocks. The high-voltage noises of electric flux line emitted from the peripheral circuit blocks are terminated, by fixing the potentials of those dopant diffusion layers and of the wells, thereby preventing the inversion of the back side of the SOI layer (in other words, a semiconductor layer) on the box (in other words, an insulation layer). A rapid signal switching of the digital circuits generates many noises in the semiconductor substrate 101. According to the embodiments of the invention, the boxes or the device isolation films blocks these noises.

Moreover, according to the embodiments of the invention, it is desirable to use a high-resistance substrate with resistivity of more than 500 Ωcm for the semiconductor substrate 101. The SOI structures on the high-resistance substrate further strengthen the crosstalk noise tolerance. It is possible to provide an inexpensive semiconductor device that operates in a high precision, and in a high speed with low power consumption, having a high tolerance against the crosstalk noises, where the circuit blocks driven in different voltages, or, the circuit blocks having a hybrid of digital and analog circuits, operate in a stable manner.

Sixth Embodiment

Figure 6:
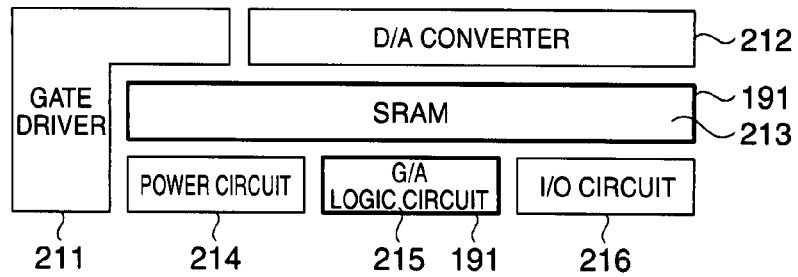
FIG. 6 is a top view drawing illustrating a configuration example of a semiconductor device according to a sixth embodiment.

FIG. 6 is a top view drawing illustrating a configuration example of a semiconductor device according to a sixth embodiment of the invention. The same signs and numerals as that of FIG. 3 are used in FIG. 6 for the parts having the same structure as indicated in FIG. 3, and the overlapping description thereof is omitted.

As shown in FIG. 6, a plurality of circuit blocks are mounted on a semiconductor substrate (semiconductor chip), and a gate driver 211, a D/A converter 212, an SRAM 213, a power circuit 214, a gate array logic circuit 215, and an I/O circuit 216 are formed as the circuit blocks. Here, the gate driver 211, the D/A converter 212, the power circuit 214, and the I/O circuit 216 are arranged in the bulk regions, and the SRAM 213 and the gate array logic circuit 215 are arranged in the SOI regions. At this time, the circuit blocks formed in the bulk regions (in other words, the circuit blocks having the bulk structure) are arranged to be adjacent to at least one side of the circuit blocks formed in the SOI region (in other words, the circuit blocks having the SOI structure). Further, the circuit blocks having the SOI structure are arranged between the circuit blocks having the bulk structure.

This allows a decrease of the distances between the adjacent circuit blocks, while suppressing the crosstalk noise between the circuit blocks, even in the case of forming, in a single chip, the driver LSI that has the SRAM 213.

Moreover, in this semiconductor device, the dopant diffusion layer 191 for potential fixing is formed on the semiconductor substrate in the periphery of the SRAM 213 that has the SOI structure, and the SRAM 213 is surrounded by the dopant diffusion layer 191, when viewed from the top. Similarly, in the semiconductor substrate in the periphery of the gate array logic circuit 215 that has the SOI structure, the dopant diffusion layer 191 for potential fixing is formed, and the gate array logic circuit 215 is surrounded by the dopant diffusion layer 191, when viewed from the top. When operating the driver LSI, a reverse bias is impressed on the dopant diffusion layer 191 in order to fix the potential of the dopant diffusion layer 191.

This allows the dopant diffusion layers 191 to block the electric flux line generated between the SRAM 213 or the gate array logic circuit 215 that have the SOI structure and the circuit blocks that have the bulk structure, suppressing the crosstalk noise therebetween. This enables to prevent the improper operation of the driver LSI, thereby improving the operational reliability.

In the sixth embodiment, the SRAM 213 and the gate array logic circuit 215 correspond to the "first circuit block" referred in claim 18. Moreover, the gate driver 211, the D/A converter 212, the power circuit 214, and the I/O circuit 216 correspond to the "second circuit block" referred in claim 18, and the "peripheral circuit block" referred in claim 21.

Seventh Embodiment

Figure 7:
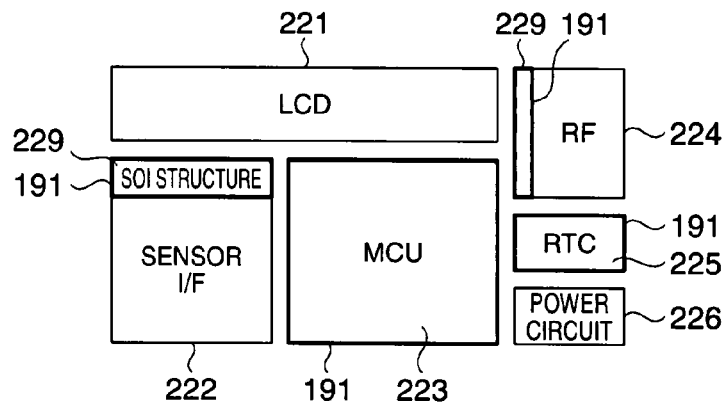
FIG. 7 is a top view drawing illustrating a configuration example of a semiconductor device according to a seventh embodiment.

FIG. 7 is a top view drawing illustrating a configuration example of a semiconductor device according to a seventh embodiment of the invention. The same signs and numerals as that of FIG. 3 are used in FIG. 7 for the parts having the same structure as indicated in FIG. 3, and the overlapping description thereof is omitted.

As shown in FIG. 7, a plurality of circuit blocks are mounted on the semiconductor substrate (semiconductor chip), and a liquid crystal controller (LCD) 221, a sensor interface circuit 222, a microcontroller unit (MCU) 223, a radio frequency (RF) circuit 224, a real time clock (RTC) circuit 225, and a power circuit 226 are formed as the circuit blocks. Here, the LCD 221, the sensor interface circuit 222, the RF circuit 224, and the power circuit 226 are arranged in the bulk regions, and the MCU 223 and the RTC circuit 225 are arranged in the SOI regions.

Moreover, in the region including at least one side of the periphery of the sensor interface circuit 222 and the RF circuit 224, SOI structures 229 are arranged adjacently to other circuit blocks. Here, the SOI structures means a structure in which an insulation layer and a semiconductor layers are deposited on a semiconductor substrate. This allows a decreasing of the distances between the adjacent circuit blocks, while suppressing the crosstalk noise between the circuit blocks, in the case of forming a system LSI in a single chip.

Moreover, in this semiconductor device, the dopant diffusion layers 191 for potential fixing are formed on the semiconductor substrate in the peripheries of the MCU 223 and the RTC circuit 225 that are arranged in the SOI regions (in other words, that have SOI structures), and the MCU 223 and the RTC circuit 225 are surrounded by this dopant diffusion layer 191, when viewed from the top. Further, the dopant diffusion layer 191 for potential fixing is formed on the substrate in the peripheries of the SOI structures 229, so as to surround the SOI structures.

This allows a blocking of the electric flux line generated between the MCU 223 or RTC circuit 225 that have the SOI structure, and the circuit blocks that have the bulk structure, suppressing the crosstalk noise therebetween. This allows a prevention of the improper operation of the system LSI, thereby improving the operational reliability.

Moreover, the power consumption during the stand-by can be significantly reduced, by forming, in the first SOI regions, the group of circuits such as RTC circuit to which the voltage is impressed during the stand-by, as well as by applying the fully depleted SOI transistors.

In the seventh embodiment, the MCU 223 and the RTC circuit 225 correspond to the "first circuit block" referred in claim 18. Further, the LCD 221, the sensor interface circuit 222, and the power circuit 226 correspond to the "second circuit block" referred in claim 18. Still further, the MCU 223 corresponds to the "microcontroller core" referred in claim 20; the sensor interface circuit 222 and the RF circuit 224 correspond to the "first peripheral circuit block" referred in claim 20; and the LCD 221 corresponds to the "second peripheral circuit block" referred in claim 20.

Eighth Embodiment

Figure 8:
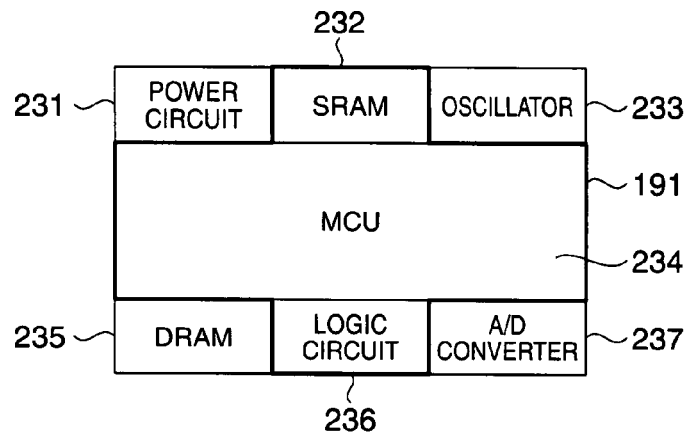
FIG. 8 is a top view drawing illustrating a configuration example of a semiconductor device according to an eighth embodiment.

FIG. 8 is a top view drawing illustrating a configuration example of a semiconductor device according to a eighth embodiment of the invention. The same signs and numerals as that of FIG. 3 are used in FIG. 8 for the parts having the same structure as indicated in FIG. 3, and the overlapping description thereof is omitted.

As shown in FIG. 8, a plurality of circuit blocks are mounted on a semiconductor substrate (semiconductor chip), and a power circuit 231, an SRAM 232, an oscillator 233, an MCU 234, a DRAM 235, and a logic circuits 236 and 237 are formed as the circuit blocks. Here, the power circuit 231, the oscillator 233, and the DRAMs 235 and 237 are arranged in the bulk regions, and the SRAM 232, the MCU 234 and the logic circuit 236 are arranged in the SOI regions. At this time, the circuit blocks formed in the bulk regions (in other words, the circuit blocks having the bulk structure) are arranged to be adjacent to at least one side of the circuit blocks formed in the SOI region (in other words, the circuit blocks having the SOI structure). Further, the circuit blocks having the SOI structure are arranged between the circuit blocks having the bulk structure.

Consequently, a plurality of circuit blocks having the bulk structure can be combined on the same semiconductor substrate, isolated from each other by the SOI structure, in the case of forming the system LSI in a single chip. This allows a decreasing of the distances between the circuit blocks, while suppressing the crosstalk noise therebetween.

Moreover, in this semiconductor device, the dopant diffusion layer 191 for potential fixing is formed on the semiconductor substrate in the periphery of the circuit blocks that have the SOI structure, and the SRAM 232, the MCU 234, and the logic circuit 236 are surrounded by the dopant diffusion layer 191 together, when viewed from the top.

This allows the dopant diffusion layer 191 to block the electric flux line generated between the circuit blocks that have the SOI structure and the circuit blocks that have the bulk structure, suppressing the crosstalk noise therebetween. This enables to prevent the improper operation of the system LSI, thereby improving the operational reliability.

In the eighth embodiment, the SRAM 232, the MCU 234, and the logic circuit 236 correspond to the "first circuit block" referred in claim 18. Moreover, the power circuit 231, the oscillator 233, and the DRAMs 235 and 237 correspond to the "second circuit block" referred in claim 18, as well as to the "peripheral circuit block" referred in claim 19. Further, the MCU 234 corresponds to the "microcontroller core" referred in claim 19; the DRAM 19 corresponds to the "memory circuit" referred in claim 19; and the oscillator 233 corresponds to the "oscillator" referred in claim 19.

As described, in the sixth to eighth embodiments, the dopant diffusion layers 191 for potential fixing are arranged between the block of the MCU or the SRAM that drive in a low voltage, having a thin SOI structure, and the block of the high-voltage driver circuits (or analog circuits) that have the bulk structure (or, a thick SOI structure). The insulation layers 103 (or boxes 103) and the device isolation films 109 electrically disconnect the low-voltage driver digital circuit blocks from the circuit blocks, such as the driver circuit block, the DRAM, and the flash memory circuit blocks that drive in a high voltage.

As a result, the crosstalk noises generated by the digital circuits do not break-in to the semiconductor substrate 101, avoiding the characteristics deterioration of the analog circuits. Particularly, when the high-resistance Si substrate is used, the crosstalk noise tolerance increases. At the same time, by impressing the reverse bias, the depletion layer that extends from the dopant diffusion layers 191 to the semiconductor substrate 101 blocks the electric field. Hence, the electric field noise from the high-voltage driver circuit blocks to the low-voltage driver circuit blocks is suppressed, enabling a highly reliable, low-voltage and low-power digital circuit operation with a high precision. As described above, according to the embodiments of the invention, it is possible to provide a highly reliable system LSI semiconductor device that excels in crosstalk noise tolerance, having therein the high-precision low-voltage driver circuit blocks and the high-voltage driver circuit blocks combined.

What is claimed is:

1. A semiconductor device, comprising:
    a first circuit block including a first transistor and a second transistor, the first transistor including a first semiconductor layer that is disposed on a first insulator layer, the second transistor including a second semiconductor layer that is disposed on a second insulator layer, the first insulator layer and the second insulator layer being disposed on a substrate, the first insulator layer and the second insulator layer being separated by a first insulating part, the first insulating part separating the first transistor and the second transistor, a low-voltage driver device including the first circuit block;
    a second circuit block including a third transistor, the third transistor including a first part of the substrate, a first high-voltage driver device including the second circuit block;
    a third circuit block including a fourth transistor, the fourth transistor including a second part of the substrate, a second high voltage driver device including the third circuit block;
    a second insulating part that separates the first circuit block and the second circuit block; and
    a third insulating part that separates the first circuit block and the third circuit block,
    the second circuit block being disposed adjacent to the first circuit block,
    the third circuit block being disposed adjacent to the first circuit block,
    the second circuit block and the third circuit block being isolated by the first circuit block.

2. The semiconductor device according to claim 1, wherein the first circuit block is arranged between the second circuit block and the third circuit block.

3. The semiconductor device according to claim 1, wherein the semiconductor substrate has a resistivity of more than 500 $\Omega$cm.

4. The semiconductor device according to claim 1, wherein the first circuit block is a digital circuit, and the second circuit block and the third circuit block are analog circuits.

5. The semiconductor device according to claim 2, wherein either the second circuit block or the third circuit block is arranged to contact at least one side of the first circuit block.

6. A semiconductor device, comprising:
    a first circuit block including a first transistor and a second transistor, the first transistor including a first semiconductor layer that is disposed on a first insulator layer, the second transistor including a second semiconductor layer that is disposed on a second insulator layer, the first insulator layer and the second insulator layer being disposed on a substrate, the first insulator layer and the second insulator layer being separated by a first insulating part, the first insulating part separating the first transistor and the second transistor, a low-voltage driver device including the first circuit block;
    a plurality of other circuit blocks arranged around the first circuit block, each of the plurality of other circuit blocks including a transistor that includes a part of the substrate;
    a plurality of high-voltage driver devices selected from at least one of the group consisting of:
        a DRAM;
        a sensor interface circuit;
        a nonvolatile memory;
        a power circuit;
        a high-voltage driver;
        a radio frequency circuit; and
        an oscillation circuit;
        a power circuit
        a driver; and
        a digital-to-analog converter,
        each of the plurality of high-voltage driver devices including at least one of the plurality of other circuit blocks; and
    a plurality of other insulating parts, each of the plurality of other insulating parts separating the first circuit block and at least one of the plurality of other circuit blocks;
    each of the plurality of other circuit blocks being disposed adjacent to the first circuit block;
    each of the plurality of other circuit blocks being isolated by the first circuit block.

7. The semiconductor device according to claim 6, wherein at least one circuit block of the plurality of circuit blocks is provided with a silicon-on-insulator structure arranged on at least one side of the periphery of the one circuit block, while contacting another circuit block of the plurality of circuit blocks.

8. The semiconductor device according to claim 6, the first circuit block being a microcontroller core.

9. The semiconductor device according to claim 6, the first circuit block being an SRAM.

10. The semiconductor device according to claim 6, the first circuit block being a real-time clock circuit and a circuit operative on stand-by.

* * * * *